United States Patent [19]

Hodges

[11] Patent Number: 4,644,315
[45] Date of Patent: Feb. 17, 1987

[54] PUSH-BUTTON SWITCH

[75] Inventor: Robert J. Hodges, Cheshunt, England

[73] Assignee: International Standard Electric Corporation, New York, N.Y.

[21] Appl. No.: 671,544

[22] Filed: Nov. 15, 1984

[30] Foreign Application Priority Data

Nov. 18, 1983 [GB] United Kingdom ............... 8330848

[51] Int. Cl.$^4$ .............................................. G01L 1/22
[52] U.S. Cl. .......................................... 338/2; 338/12; 338/198; 73/862.65
[58] Field of Search .................... 338/2, 198, 12, 32 R, 338/47; 33/312, 313; 73/862.65, 701, 723; 74/573 R; 200/67 DB, 67 DF

[56] References Cited

U.S. PATENT DOCUMENTS 4,021,766 5/1977 Aine ........................................ 338/2
4,267,725 5/1981 Roth et al. ...................... 73/862.65
4,411,159 10/1983 Spear et al. ............................ 338/2

FOREIGN PATENT DOCUMENTS 1195674 6/1970 United Kingdom .

Primary Examiner—E. A. Goldberg
Assistant Examiner—M. M. Lateef
Attorney, Agent, or Firm—John T. O'Halloran; Thomas F. Meagher

[57] ABSTRACT

In a push-button switch, the switch element is a cantilever (2) of thin silicon strain gauge material with a small magnet (1), e.g. of samarium cobalt alloy at its free end. Adjacent to the free end there is an annular magnet (3), e.g. of plastics material impregnated with samarium cobalt alloy, on the push rod (4) of the switch. The annular magnet (3) is so poled that movement of the rod (4) causes, due to magnetic forces, the deflection of the silicon strain gauge to give an electrical output.

The return force, plus collapse action, is provided by a soft iron collar (5) on the switch structure.

7 Claims, 4 Drawing Figures

PUSH-BUTTON SWITCH

This invention relates to electrical switching devices using thin silicon strain-gauge transducers as the switch elements.

According to the invention, there is provided an electrical switching device, in which the switch element is a strain gauge made of thin silicon so mounted that when deflected it produces an electrical output representative of that deflection, in which the switch element carries a permanent magnet, and in which the deflection of said switch element to produce the electrical output is effected by the relative movement of the switch element and of a source of permanent magnetism.

Embodiments of the invention will now be described with reference to the accompanying drawing, in which FIG. 1 is a part-sectioned representation of a push-button switch embodying the invention, FIG. 2 is a scrap view of a preferred arrangement for the movable switching member of the switch shown in FIG. 1.

Thin silicon strain gauge transducers are now well-known for switch applications. In the devices to be described herein, magnets are used to cause deflection of the strain gauge transducer when the switch is operated. Thin silicon transducers use the excellent mechanical properties of silicon together with its doping and etching properties to produce thin silicon strain gauge transducers capable of producing relatively large electrical outputs. The transducer designs so far produced all have a strained element fabricated in thin silicon which has doped into its surface a piezo-resistive strain gauge. Because the strained element is approximately 20 microns thick, and the material has a very high modulus of elasticity, it can withstand large deflections. The strained elements are typically either diaphragms or cantilevers with the piezo-resistive bridge positioned at the point of maximum strain. In the devices to be described herein the transducer uses a cantilever, but a diaphragm could also be used.

Figure 1:
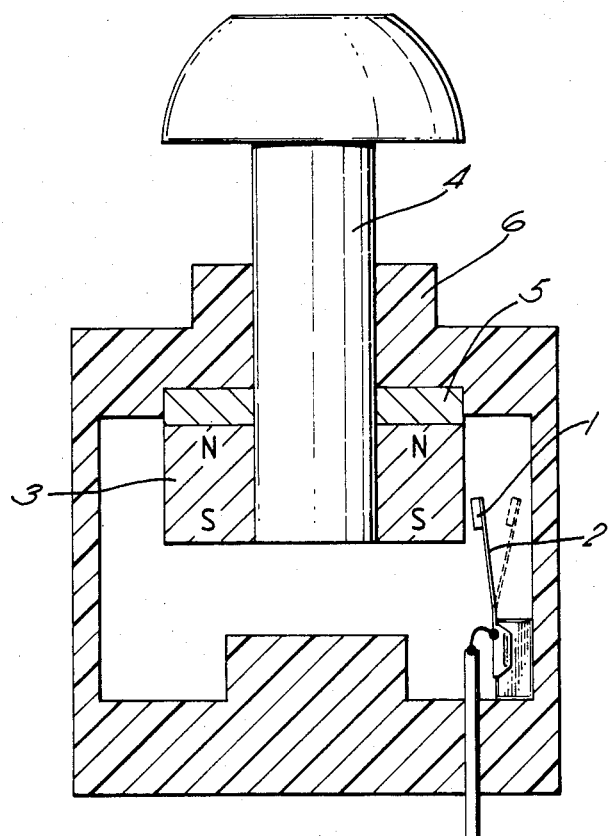

As will be seen from FIG. 1, a small permanent magnet 1 is attached to the end of the cantilever arm 2 of the transducer, the magnet having its left-hand face North polarity and its right-hand face South polarity. Thus magnet 1 is attracted or repelled by a second annular magnet 3 attached to the switch stem 4. The permanent magnet 1, which is bonded to the actuator cantilever 2, is typically a samarium cobalt magnet 0.020"×0.020"×0.008" thick. The second magnet 3, which may be plastics loaded with either samarium cobalt or hard ferrite, is attached to the stem 4 of the push-button switch as shown.

At the inside top of the switch body there is mounted a soft iron washer 5 bonded to the body 6. The strain gauge on the silicon transducer is connected to termination pins such as 7. The force characteristic between the actuator permanent magnet 3 and the soft iron armature 5 defines the collapsing feel of the switch. At rest the south pole of the actuator magnet 3 attracts the north pole of the transducer magnet, deflecting the transducer to the left of its rest position. When the key is fully deflected, the north pole of the actuator magnet 3 repels the north pole of the transducer magnet 1 deflecting the actuator cantilever 2 to the right, providing a large output voltage from the bridge. By employing magnetic coupling in place of mechanical coupling, a minimum number of piece-parts are required and wide tolerances may be used. Magnet costs may be minimised by moulding the magnets "in-house" and stray fields may be contained by mounting the keys on steel supporting plates.

Figure 2:
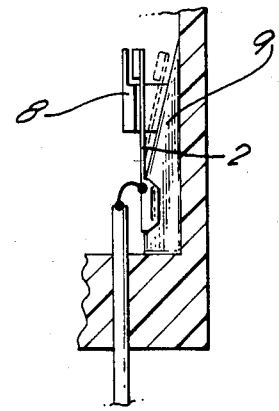

In practice with an arrangement such as shown in FIG. 1 there is a risk of mechanical resonance in the movable transducer 2. To overcome this, the arrangement of FIG. 2 is used. Here the transducer 2 moves between fixed end stops 8 and 9, the end stop on the left hand side being as thin a possible, e.g. 50 microns thick, to reduce the reluctance of the gap between the magnets. In addition, damping is provided by a layer of lacquer or rubber on the transducer element or on the co-operating surfaces of the end stops.

Figure 3:
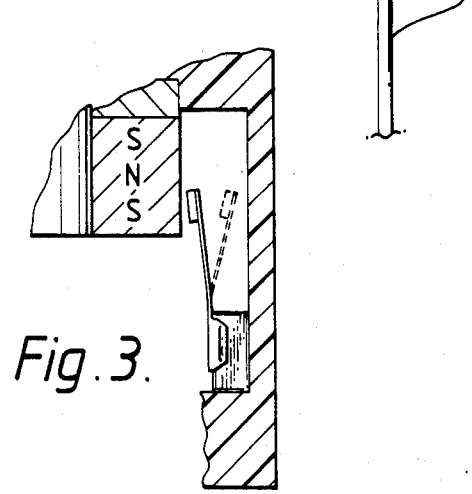
FIG. 3 is a scrap view of a modified version of the switch of FIG. 1.

FIG. 3 shows a monostable version of the switch, in which if the magnet surface is magnetised, as shown a pulse output is produced from the switch. This principle can be extended so that the area of magnet adjacent to the transducer can be recorded with a magnet pattern equivalent to the code of the key so that when the key was depressed it would generate a pulse train representative of the binary code for the key. The magnetic polarisations shown are the simplest for the application. Other configurations may be used to improve efficiency or to reduce stray fields. Note that the end stops and damping means shown in FIG. 2 can also be used with the arrangement of FIG. 3 if the same difficulty, i.e. mechanical resonance arises.

Figure 4:
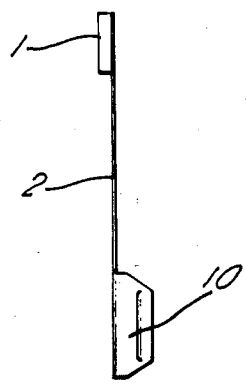
FIG. 4 shows separately the switch element of a switch such as that shown in FIG. 1 or FIG. 2.

FIG. 4 shows the switch element, i.e. the cantilever 2, with its magnet 1 on one end, polarised as shown. At the other end the element is formed with side flanges one of which is seen at 8, and to which flanges the pins such as 7 are connected. Thus when the element is deflected in response to push-button operation, an electrical potential is developed between the lead-out pins such as 7.

The arrangement of the magnet 3 and of the ring 5 ensures that the switch resets readily when the push-button is released after operations. Thus no return spring is needed. Further the number of moving parts is very small.

Another arrangement for the location of the thin silicon transducer is for it to be set at right-angles to the position shown in FIG. 1. That is, the transducer is roughly parallel to a tangent to the surface of the annular magnet. Such an arrangement would have the merit that it tends to produce more equal force of attraction and repulsion than does the arrangement shown. This in turn would in many cases lead to more symmetrical output pulse shapes.

I claim:

1. An electrical switching device, in which the switch element is a strain gauge made of thin silicon so mounted that when deflected it produces an electrical output representative of that deflection, in which the switch element carries a permanent magnet, and in which the deflection of said switch element to produce the electrical output is effected by the relative movement of the switch element and of a source of permanent magnetism.

2. A device as claimed in claim 1, in which the switch element is a silicon strain gauge cantilever having one of its ends secured to the device structure and a high coercivity magnet attached to its other end, and in which the end with the magnet is adjacent to a magnet forming said source whose movement by a switch actuator deflects the strain gauge so that the latter delivers an output representative of the movement of the actuator.

3. A device as claimed in claim 2, in which the actuator is the push rod of a push-botton switch, in which the source magnet is an annular magnet on the pus rod, and in which a collar of soft iron embracing the push rod is secured to the device structure, the attraction between the collar and the source magnet providing the return force for the device.

4. A device as claimed in claim 3, in which the polarisation of the annular magnet is S-N-S, (or N-S-N) from one of its end faces to the other, so that the switch output is of pulse form.

5. A device as claimed in claim 4, in which the magnet is so polarised that the succession of magnetic poles (N,S) together define a code, so that depression of the switch causes the generation of a coded output.

6. A device as claimed in claim 1, in which the magnet on the switch element is of a samarium cobalt alloy and the source magnet is of a plastics material impregnated with a samarium cobalt alloy powder.

7. A device as claimed in claim 2, in which the actuators are mounted on steel supporting plates.

* * * * *